United States Patent [19]

Funakawa et al.

[11] 4,080,621
[45] Mar. 21, 1978

[54] GLASS PASSIVATED JUNCTION SEMICONDUCTOR DEVICES

[75] Inventors: Shigeru Funakawa; Masahiro Yamane, both of Itami, Japan

[73] Assignee: Mitsubishi Denki Kabushiki Kaisha, Tokyo, Japan

[21] Appl. No.: 791,343

[22] Filed: Apr. 27, 1977

[30] Foreign Application Priority Data

Jul. 6, 1976  Japan ................................ 51-80737

[51] Int. Cl.² ................................ H01L 29/34
[52] U.S. Cl. .................... 357/54; 357/56; 357/59; 357/73; 428/331; 428/428
[58] Field of Search ............. 357/54, 59, 73, 76, 357/56; 428/331, 428

[56] References Cited

U.S. PATENT DOCUMENTS

| | | | |
|---|---|---|---|
| 3,247,428 | 4/1966 | Perri et al. | 357/73 |
| 3,837,002 | 9/1974 | Sakamoto et al. | 357/73 |
| 4,002,541 | 1/1977 | Streander | 428/331 |

*Primary Examiner*—Stanley D. Miller, Jr.
*Assistant Examiner*—Joseph E. Clawson, Jr.
*Attorney, Agent, or Firm*—C. L. Menzemer

[57] ABSTRACT

This invention is directed to a semiconductor device comprised of a body of semiconductor material having at least one p-n junction terminating at an exposed surface of the body. The p-n junction is passivated at its termination point by a first, thin glass layer and a second glass layer disposed over the first thin glass layer. The second glass layer is thicker than the first glass layer and includes a predetermined amount of a suitable filler material.

4 Claims, 5 Drawing Figures

GLASS PASSIVATED JUNCTION SEMICONDUCTOR DEVICES

BACKGROUND OF THE INVENTION

1. Field of the Invention

The present invention is in the field of passivation of semiconductor devices generally, and specifically in the field of glass passivation of p-n junctions.

2. Description of the Prior Art

P-N junctions have been passivated with organic materials such as silicone resins, silicone varnishes and silicone rubbers. In some cases these organic coatings contained fillers, usually metallic particles.

The organic coatings in general were not totaly stable, especially at elevated temperatures to be considered reliable.

Thin glass coatings, having a thickness of from about $5\mu$ to $20\mu$, have been used and were in general more stable than the organic coatings. However, such thin glass coatings are not entirely satisfactory because ions of heavy metals adhere to the glass coating and the thin glass coatings themselves react with hydrogen gas in furnaces used to braze the glass coated wafer to metallic bases.

Both of these occurrences lead to deterioration of the electrical characteristics of the semiconductor device.

It is known that the effect of the ions of heavy metals on the electrical characteristics of the device and the reaction of the glass coating with the hydrogen gas in the brazing furnace can be reduced to an acceptable degree if a thick glass coating, as for example a glass coating having a thickness of from $30\mu$ to $50\mu$ is employed.

However, at this thickness, the mismatch in thermal expansion between the glass coating and the semiconductor material causes the glass coating to crack and the electrical characteristics of the semiconductor device deteriorate.

SUMMARY OF THE INVENTION

The present invention overcomes the disadvantages of the prior art and comprises covering an exposed portion of a p-n junction in a semiconductor body with a first, relatively thin, $3\mu$ to $10\mu$ thick glass coating and depositing a second, relatively thick, $30\mu$ to $50\mu$, glass coating over said first glass coating, said second glass coating containing a quantity of particles of the same semiconductor material as the semiconductor body containing the p-n junction.

DESCRIPTION OF THE DRAWING

For a better understanding of the present invention reference should be had to the following detailed description and drawing in which.

DESCRIPTION OF THE PREFERRED EMBODIMENT

Figure 1:
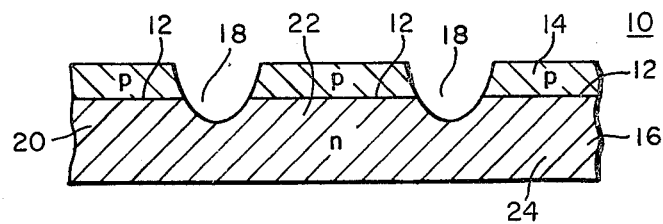
FIGS. 1 to 4 inclusive, are sectional views of a body or wafer of silicon being processed in accordance with the teachings of this invention.
Figure 2:
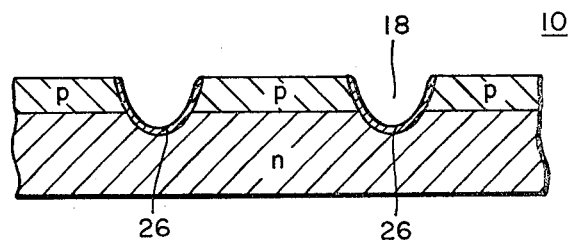

With reference to FIG. 1, there is shown a silicon wafer or body 10 formed by diffusing boron or other p-type impurity into an n-type silicon wafer to form a pn junction 12 between p-type region 14 and n-type region 16, and further employing photolithographic and etching techniques to form grooves 18 sufficiently deep to expose the pn junction 12. By forming the grooves 18 in the silicon wafer or body 10, a plurality of diodes 20, 22 and 24 having a common region 16 are formed within the silicon wafer 10. After the formation of the grooves 18, an inorganic glass coating is disposed in the grooves 18 and is fired to cover exposed portions of the pn junction 12 with first glass coatings or layers 26 as shown in FIG. 2. The thickness of this first glass layer 26 may range from about 3 to $10\mu$.

Figure 3:
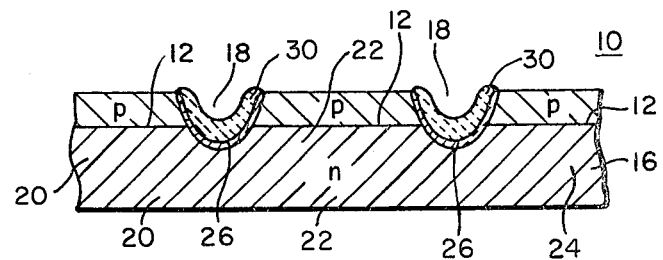

Then a silicon powder of suitably sized particles for example, of 500 mesh and a glass powder are mixed with each other. For example, the silicon powder may be mixed in a proportion of from 3 to 6 parts by weight for 10 parts by weight of the glass. Then said mixed powder is mixed with butyl carbitol and ethyl cellulose in suitable proportions respectively and the glass-silicon liquid at suitable viscosity is coated upon the first glass layers 26 and fired to form second glass layers 30 as shown in FIG. 3.

Since butyl carbitol and ethyl cellulose within said liquidized glass are either evaporated off during the firing of the glass or react with oxygen in the firing atmosphere to be vaporized, they are not left in the second glass layers 30. Therefore butyl carbitol and ethyl cellulose do not exert any effect on the second glass layers 30.

Subsequently, as sjown in FIG. 4, ohmic metallic electrodes 40, as for example nickel-gold laminates are provided on the surfaces p- and n-type region 14 and 16 respectively of the silicon wafer 10. Thereafter, the silicon wafer 10 is cut along A-A' and B-B;40 of FIG. 4 to obtain a diode 50 shown in FIG. 5.

Figure 4:
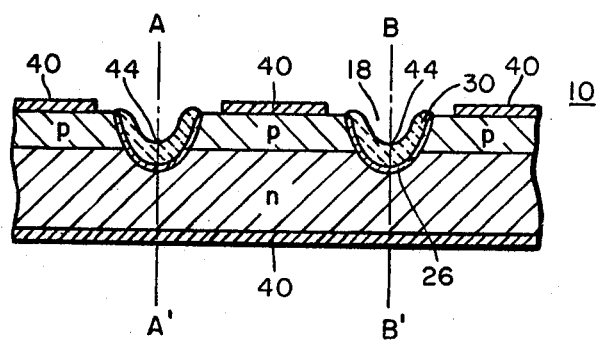

The diode 50 of FIG. 4 has a passivating glass layer 42 comprised of the first glass coating or layer 26 and the second glass coating 30 mixed with the silicon powder of 500 mesh. As the first glass coating 26 is very thin, of the order of from $3\mu$ to $10\mu$, any difference in coefficient of thermal expansion between the first glass layer 26 and the silicon body 10 does not lead to cracking of the glass due to any strains resulting from heating the structure.

The second glass coating or layer 30, containing the silicon powder, has a different coefficient of thermal expansion than the first glass layer 26 in accordance with an amount of the silicon and can approximate the magnitude of the coefficient of thermal expansion of the silicon body 10. For this reason, the present invention has the characteristic feature that, even with the thickness of glass film thickened so that the second glass layer 30 is from $30\mu$ to $50\mu$ thick, the glass, the first and second glass layers becomes very difficult to crack.

Figure 5:
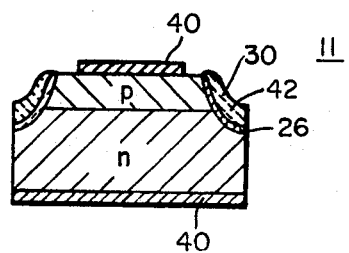
FIG. 5 is a sectional view of a diode prepared in accordance with the teachings of this invention.

A method suitable for cutting the silicon wafer 10 along the lines A-A' and B-B' in order to obtain the diode 50 shown in FIG. 5 is the so-called laser scribing method. This method comprises applying a ray of laser light along the bottom portions 44 (see FIG. 4) of the second glass layer 3 within the groove 18.

In silicon wafers subjected to the conventional prior art thick layer glass passivation, the thick glass layer is fusion welded to the portions of the grooves. Therefore where a ray of laser light is applied to the thick glass layer to effect the laser scribing the laser light is transmitted through the glass and some of the energy of laser is transmitted to the silicon body whereby the energy is converted to heat within the silicon wafer. This results in a local evaporation of the silicon wafer just under the glass fusion and that portion of the glass through which laser light has passed is broken by means of an explosive vapor pressure and heat from the silicon. This results in irregular cracks in the glass along a scribed line. These cracks subsequently cause the device to lose its desired electrical characteristics.

However, with the glass passivation of the present invention, the application of laser light to the bottom portion 44 of the second layer 30 causes the energy from the laser light falling upon the particles of the silicon powder to change to heat within the second glass layer 30. This heat is conveyed to the glass portions around the particles of the silicon powder and raises the temperature of the glass resulting in the glass converting to its molten state. On the other hand, the laser light not falling on the particles of the silicon powder within the second glass layer 30 reaches the silicon wafer 10 where the energy from the light is converted to heat. That portion of the silicon wafer 10 subjected to the laser light is locally raised to an elevated temperature resulting in the occurrence of an explosive vapor pressure. However, as above described, the second glass layer 30 is in its molten state so that any silicon vapor passes through that layer and escapes. Thereafter, the glass is lowered in temperature to be solidified. Thus the glass does not crack.

Further, due to the presence of the first glass layer 26 being relatively thin the present invention has the characteristic feature that the electric characteristics of the diode do not deteriorate. This is because the particles of the silicon powder disposed within the second glass layer 30 do not directly contact the exposed portion of the pn junction. If the second glass layer 30 would be directly formed on the surface of the groove 18 then the particles of the silicon powder would contact the exposed pn junction. This could cause a flow of current through the particles of the silicon powder and result in the deterioration of the electric characteristics of the diode.

While the invention has been described in conjunction with a preferred embodiment calling for silicon powder being used in the second glass layer it should be understood that particles of silicon carbide of carbon may be used in addition to the silicon.

It should also be understood that instead of the silicon powder particles of a powder of an inorganic material may be used. The criteria for selecting such inorganic material being that the coefficient of thermal expansion of the second glass layer does not differ from that of silicon to cause cracking when heated to elevated temperatures of not less than about 700° C and does not cause deterioration of the electric characteristic of semiconductor devices.

It should also be understood that while the present invention has been set forth specifically using a diode for an example, the invention is equally applicable to transistors and thyristors.

We claim as our invention:

1. A semiconductor device comprising, a body of semiconductor material, at least one p-n junction contained within said body of semiconductor material, at least a portion of said p-n junction being exposed at a surface of said body of semiconductor material, a first glass coating disposed over said exposed portion of said p-n junction and a second glass coating disposed over said first glass coating, said second glass coating containing a quantity of particles of the same semiconductor material as comprises the body of semiconductor material containing the p-n junction.

2. The device of claim 1 in which the first glass coating has a thickness of from $3\mu$ to $10\mu$, and the second coating has a thickness of from $30\mu$ to $50\mu$.

3. The device of claim 2 in which the second glass coating comprises, by weight, 3 to 6 parts of particles of semiconductor material per 10 parts of glass.

4. The device of claim 1 in which the second glass coating contains in addition to the particles of semiconductor materials, particles of an inorganic material.

* * * * *